United States Patent
Langhammer et al.

(10) Patent No.: US 8,898,551 B1
(45) Date of Patent: Nov. 25, 2014

(54) REDUCED MATRIX REED-SOLOMON ENCODING

(75) Inventors: Martin Langhammer, Salisbury (GB); Daniel Elphick, Oxford (GB)

(73) Assignee: Altera Corporation, San Jose, CA (US)

( * ) Notice: Subject to any disclaimer, the term of this patent is extended or adjusted under 35 U.S.C. 154(b) by 185 days.

(21) Appl. No.: 13/530,683

(22) Filed: Jun. 22, 2012

(51) Int. Cl.
*H03M 13/15* (2006.01)

(52) U.S. Cl.
CPC .......... *H03M 13/1515* (2013.01); *H03M 13/15* (2013.01)
USPC .......................................... 714/784; 714/781

(58) Field of Classification Search
CPC .......... H03M 13/1515; H03M 13/151; H03M 13/1545; H03M 13/158; H03M 13/15; H03M 13/09; H03M 13/091; H04L 1/0057
USPC .................... 714/784, 781, 752, 746; 708/751
See application file for complete search history.

(56) References Cited

U.S. PATENT DOCUMENTS

| | | | |
|---|---|---|---|
| 7,178,091 B1 * | 2/2007 | Alon | 714/784 |
| 8,176,397 B2 * | 5/2012 | Panteleev et al. | 714/784 |
| 8,607,129 B2 * | 12/2013 | Radhakrishnan et al. | 714/781 |
| 2009/0199075 A1 * | 8/2009 | Demjanenko et al. | 714/784 |

* cited by examiner

*Primary Examiner* — Shelly A Chase
*Assistant Examiner* — Christian Dorman
(74) *Attorney, Agent, or Firm* — Ropes & Gray LLP (57) ABSTRACT

In an arrangement of the disclosed systems, devices, and methods, a matrix representation of a block code comprising m bit-planes is obtained, a generator matrix corresponding to each of the m bit-planes from the matrix representation is extracted, a transformed generator matrix and a transformed data symbol vector for the first bit-plane of the block code are determined, a reverse-mapped transformed generator matrix for each of the second bit-plane through the $m^{th}$ bit-plane of the block code are determined, and instructions for the encoder architecture based on the transformed generator matrix for the first bit-plane and the reverse-mapped transformed generator matrix for each of the second bit-plane through the $m^{th}$ bit-plane of the block code are generated.

19 Claims, 6 Drawing Sheets

REDUCED MATRIX REED-SOLOMON ENCODING

FIELD OF THE INVENTION

This invention relates to Reed-Solomon encoding, and to circuitry for performing such encoding, particularly in an integrated circuit device such as a programmable logic device (PLD).

BACKGROUND OF THE INVENTION

Reed-Solomon encoding may be implemented in circuitry using matrix multiplication logic. An implementation based on matrix multiplication, whether in a Field Programmable Gate Array (FPGA), PLD, or other logic device, allows a Reed-Solomon encoder to run at a maximum device frequency. Further, a multiplication-based implementation reduces or eliminates feedback paths that are normally required in a division-based implementation so that data may be pipelined to increase an effective data throughput.

While multiplication-based Reed-Solomon encoding may be pipelined to match a desired data rate, multiplication-based implementations generally require a significant amount of logic, for example, a significant number of adaptive look up tables (ALUTs). For example, the IEEE 802.3 standard specifies hard and soft forward error correction at throughputs of four channels at 25 gigabits per second (Gb/s), four channels at 28 Gb/s, and one channel at 100 Gb/s. A conventional multiplication-based Reed-Solomon encoder pipelined to achieve these data throughputs may use on the order of 30,000 ALUTs, which entails significant cost, power, and device area requirements.

SUMMARY OF THE INVENTION

Described herein are systems, devices, and methods for producing a plurality of check symbols. Input circuitry receives a data vector comprising a plurality of data symbols, each data symbol having a bit-depth m. A first adder bank processes the data vector to produce a transformed data vector and a plurality of m additional adder banks processes a respective bit-slice of the transformed data vector to produce an output based on a respective reverse-mapped generator matrix. A reducer bank processes the outputs of each of the plurality of m additional adder banks to produce the plurality of check symbols.

In certain arrangements, the first adder bank produces the transformed data vector by appending a plurality of parameters to the data vector. In certain arrangements, each reverse-mapped generator matrix is produced based on the transformed data vector. In certain arrangements, a plurality of m sets of data connections correspond, respectively, to inputs to the plurality of m additional adder banks. In certain arrangements, the plurality of parameters is generated according to an iterative matrix transform. In certain arrangements, the set of data connections corresponding to a given adder bank in the plurality of m additional adder banks is based on the non-zero entries of a corresponding reverse-mapped generator matrix.

Also described herein are systems, devices, and methods for configuring an encoder architecture. A matrix representation of a block code comprising m bit-planes is obtained. A generator matrix corresponding to each of the m bit-planes is extracted from the matrix representation. A transformed generator matrix and a transformed data symbol vector are determined for the first bit-plane of the block code. A reverse-mapped transformed generator matrix is determined for each of the second bit-plane through the $m^{th}$ bit-plane of the block code. Instructions for the encoder architecture are generated based on the transformed generator matrix for the first bit-plane and the reverse-mapped transformed generator matrix for each of the second bit-plane through the $m^{th}$ bit-plane of the block code.

In certain arrangements, the reverse-mapped transformed generator matrix for a bit-plane of the block code is determined based on the transformed data symbol vector. In certain arrangements, a data symbol vector is extracted from the first plane of the block code. In certain arrangements, determining the reverse-mapped transformed generator matrix for a bit-plane of the block code comprises generating a frequency match matrix based on the transformed generator matrix for the first bit-plane.

In certain arrangements, the instructions are in the form of a configuration layout file. In certain arrangements, the block code is a (n, k, m) Reed-Solomon code. In certain arrangements, the instructions for the encoder architecture are for implementation in an FPGA. In certain arrangements, determining the reverse-mapped transformed generator matrix for the bit-plane of the block code further comprises adding a column to the reverse-mapped transformed generator matrix in response to a determination that a highest frequency element of the frequency match matrix is greater than a predefined value.

Also described herein are systems, devices, and methods for producing a plurality of check symbols using two adder banks for each of m bit-slices of a block code. Input circuitry receives a data vector comprising a plurality of data symbols, each data symbol having a bit-depth m. For each of m bit-slices of a block code, a first adder bank processes the data vector to produce a transformed data vector based on the respective bit-slice, and a second adder bank processes the transformed data vector based on a reverse-mapped generator matrix for the bit-slice to produce an output. A reducer bank processes the output of each second adder bank corresponding to each of the m bit-slices of the block code produce the plurality of check symbols.

In certain arrangements, the first adder bank produces the transformed data vector by appending a plurality of parameters to the data vector. In certain arrangements, each reverse-mapped generator matrix is produced based on the transformed data vector. In certain arrangements, the plurality of parameters is generated according to an iterative matrix transform. In certain arrangements, the block code is a (n, k, m) Reed-Solomon code. In certain arrangements, the circuitry is implemented in an FPGA.

BRIEF DESCRIPTION OF THE DRAWINGS

The above and other advantages of the invention will be apparent upon consideration of the following detailed description, taken in conjunction with the accompanying drawings, in which like referenced characters refer to like parts throughout, and in which.

DETAILED DESCRIPTION OF THE INVENTION

Disclosed herein are methods, systems, and apparatus for implementing Reed-Solomon encoding in a network environment. The disclosed methods, systems, and apparatus advantageously reduce a number of ALUTs required for an encoder implementation in a pipelined architecture.

For the purposes of illustration, and not limitation, the disclosed methods, systems, and apparatus are described in terms of (n, k, m) Reed-Solomon encoding, in which k data symbols, denoted $x_1, \ldots, x_k$, respectively, are transformed into a codeword of n symbols, denoted $y_1, \ldots, y_n$, respectively. The number of check symbols in the codeword is therefore n−k. The bit-depth of each symbol is denoted by m. For example, a Reed-Solomon encoding scheme in which k=239 data symbols are encoded into n=255 coded symbols and having a depth of m=8 bits per symbol is denoted as a (255, 239, 8) Reed-Solomon code. Also for the purposes of illustration, and not limitation, this disclosure describes systematic Reed-Solomon encoding, in which length-n codewords are formed by appending the n−k parity check symbols directly to the data symbols $x_1, \ldots, x_k$. Thus, $y_1=x_1$, $y_2=x_2, \ldots y_k=x_k$.

The check symbols in Reed-Solomon encoding are produced through the matrix operation $$\underline{y}=S\underline{x} \quad (1)$$

where $\underline{y}=[y_{k+1}, y_{k+2}, \ldots, y_n]^T$ contains the check symbols, data symbol vector $\underline{x}=[x_1, x_2, \ldots, x_k]T$ contains the data symbols, $(.)^T$ denotes the transpose operator, and S is a n−k×k encoding matrix. Further, because each symbol in $\underline{x}$ has a bit-depth m, equation (1) may be expressed in terms of m separate bit-slices. Specifically, through the series of equations $$\underline{y}_1=S_1\underline{x}_1, \quad (2)$$

$$\underline{y}_2=S_2\underline{x}_2, \quad (3)$$

$$\underline{y}_m=S_m\underline{x}_m, \quad (4)$$

where $\underline{y}_i$ and $\underline{x}_i$ are binary valued vectors corresponding to the $i^{th}$ slice of the check symbols $\underline{y}$ and the data symbols $\underline{x}$, respectively, and $S_i$ is the n−k×k binary-valued generator matrix corresponding to the $i^{th}$ slice of the generator matrix S. The matrix $S_i$ has the following form $$S_i = \begin{pmatrix} s_{11} & s_{21} & s_{31} & \cdots & s_{k1} \\ s_{12} & s_{22} & s_{32} & \cdots & s_{k2} \\ s_{13} & s_{23} & s_{33} & \cdots & s_{k3} \\ \vdots & \vdots & \vdots & \ddots & \vdots \\ s_{1(n-k)} & s_{2(n-k)} & s_{3(n-k)} & \cdots & s_{k(n-k)} \end{pmatrix}, \quad (5)$$

where the i subscript has been dropped on all terms on the right-hand side of equation (5) for brevity.

Figure 1:
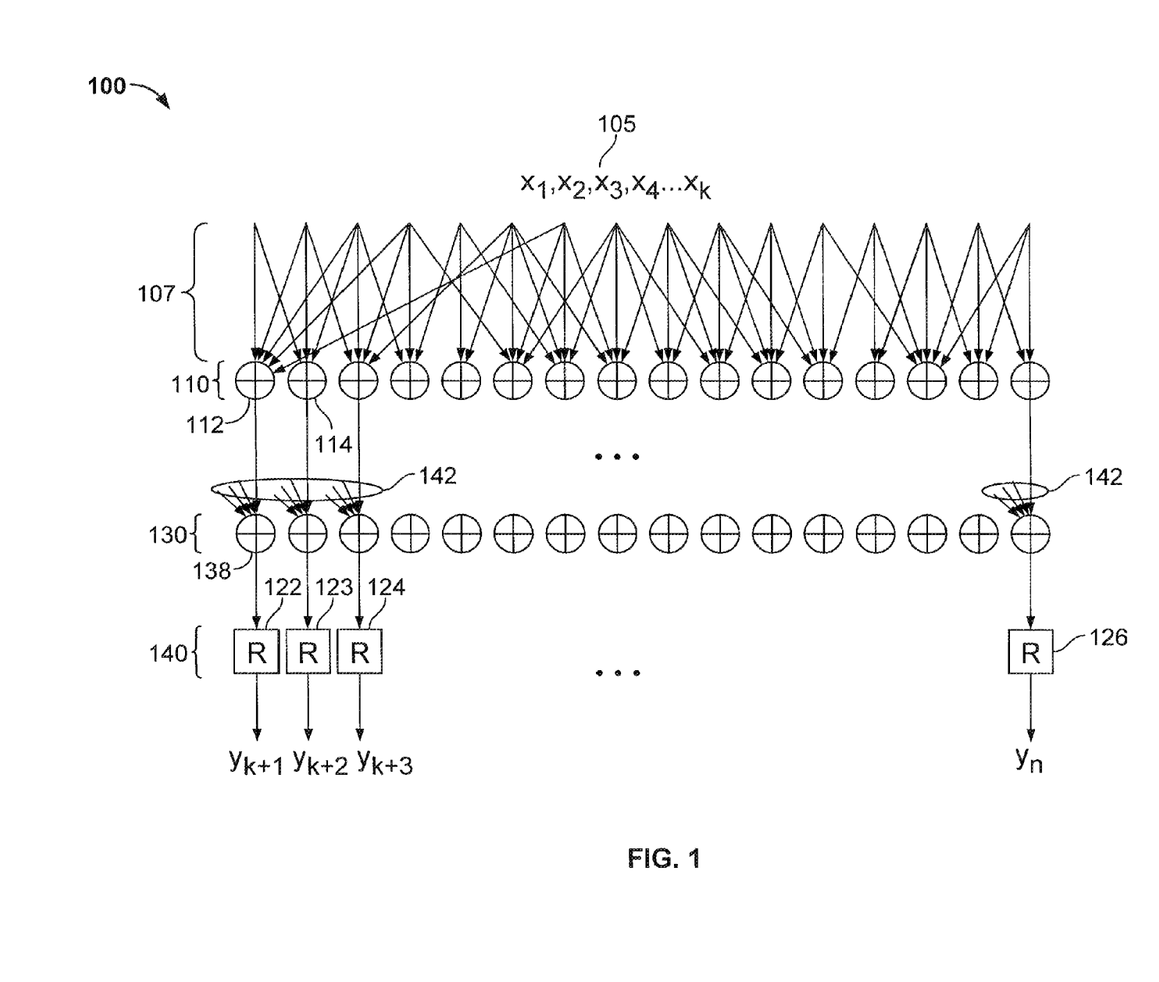
FIG. 1 illustrates a bit-plane based Reed-Solomon encoding architecture.

FIG. 1 illustrates a bit-plane based Reed-Solomon encoding architecture. Architecture 100 is a feed-forward multiplication-based architecture which includes one adder bank for each bit slice in the matrix representation of a Reed-Solomon code (i.e., the architecture 100 includes a total of m adder banks). The first adder bank, adder bank 110, produces the output $\underline{y}_1$ of equation (2). In particular, adder 112 of the adder bank 110 receives, via data connections 107, an input corresponding to each non-zero entry in the first row of $S_1$ of equation (2). The adder 112 adds its received inputs to produce a first data symbol in the vector $\underline{y}_1$. Similarly, adder 114 of the adder bank 110 receives, via the data connections 107, an input corresponding to each non-zero entry in the second row of $S_1$ of equation (2). The adder 114 adds its received inputs to produce a second data symbol in the vector $\underline{y}_1$. In this way, the n−k outputs of $\underline{y}_1$ are produced from the respective n−k adders of the adder bank 110. Note also that the data connections 107 connect a given input to a given adder of the adder bank 110 only if the corresponding matrix entry in $S_1$ is non-zero valued.

In a similar manner to that described above, the n−k outputs of $\underline{y}_2$ are produced from the respective n−k adders of a second adder bank of the architecture 100 (not illustrated in FIG. 1), the n−k outputs of $\underline{y}_3$ are produced from the respective n−k adders of a third adder bank of the architecture 100 (not illustrated in FIG. 1), and so on. For example, the n−k outputs of $\underline{y}_m$ are produced from the respective n−k adders of the $m^{th}$ adder bank, adder bank 130. Note also that each adder bank of the architecture 100 uses a different set of data connections to provide the appropriate inputs from data symbols 105. For example, data connections 142 of the $m^{th}$ adder bank, adder bank 130, correspond to the non-zero entries of the matrix $S_m$.

The reducers of reducer bank 140 are used to combine the outputs of the adders of the architecture 100 to produce the n−k check symbols $y_{k+1}, y_{k+2}, \ldots, y_n$. For example, reducer 122 shifts and sums the outputs of the m adders in the leftmost data path of the architecture 100 (which includes the adders 112 and 138) to produce check symbol $y_{k+1}$. Similarly, reducers 123, 124, and 126 produce the check symbols $y_{k+2}$, $y_{k+3}$, and $y_n$, respectively. The m adder banks of the architecture 100 may require a significant amount of adder logic, for example, in the form of ALUTs.

Figure 2:
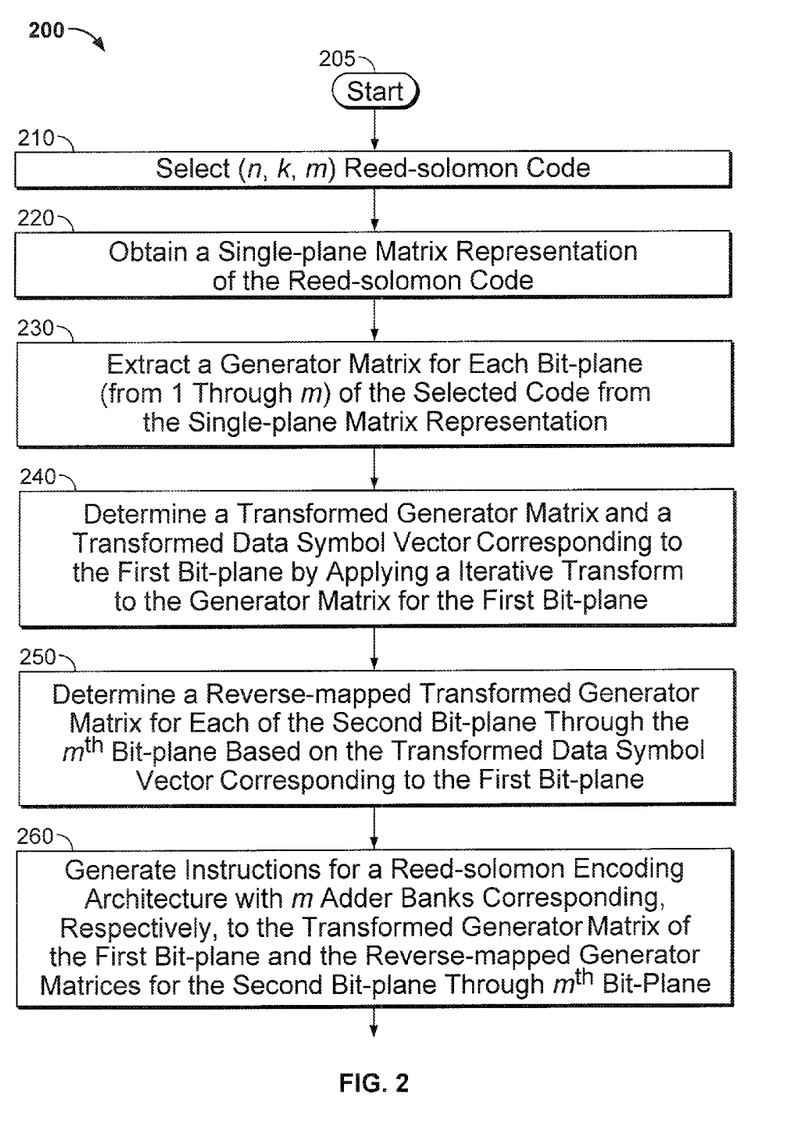
FIG. 2 illustrates a process for configuring a bit-plane based Reed-Solomon encoding architecture using a reduced amount of addition logic in accordance with an embodiment of the present invention.

FIG. 2 illustrates a process for configuring a bit-plane based Reed-Solomon encoding architecture using a reduced amount of addition logic (e.g., ALUTs) in accordance with an embodiment of the present invention. Process 200 starts at step 205. At step 210, a (n, k, m) Reed-Solomon code is selected. The code is selected using any suitable technique. For example, the code pre-determined based on error characteristics of a data network over which encoded data is to be transmitted, selected dynamically based on real-time network conditions, and/or may be selected based on a communications standard (e.g., an IEEE standard) that will be used to transmit coded data. Any suitable Reed-Solomon code may be selected, for example, a (255, 239, 8) or (255, 239, 10) Reed-Solomon code may be selected at the step 210.

At step 220, a single-plane matrix representation of the selected Reed-Solomon code is obtained. In particular, with reference to equation (1), the data vector $\underline{x}$ and the encoding matrix S for the selected Reed-Solomon code are obtained. At step 230, a m-plane representation of the Reed-Solomon code is extracted from the data vector $\underline{x}$ and the encoding matrix S. In particular, with reference to equations (2) through (4), the quantity $S_i$, the n−k×k binary-valued generator matrix corresponding to the $i^{th}$ slice of the generator matrix S, is obtained for each value of i between 1 and m.

At step 240, a transformed generator matrix, $S_1^*$, and a transformed data symbol vector, $\underline{x}_1^*$, are obtained for the first bit-plane based on the quantities $S_1$ and $\underline{x}_1$. In particular, as will be described below, the quantities $S_1^*$ and $\underline{x}_1^*$ are determined though an iterative processing technique (possibly using just a single iteration) so that the following relationship is satisfied $$S_1^* \times \underline{x}_1 = S_1 \times \underline{x}_1,$$

and so that computation of the matrix product $S_1^* \times \underline{x}_1^*$ requires fewer addition operations than computation of the matrix product $S_1 \times \underline{x}_1$. As will be explained below, the $x^*$ includes all the elements of $\underline{x}_1$ in addition to $\Delta$ additional elements, where $\Delta$ is a non-negative integer. Thus, $\underline{x}_1^* = [x_1, x_2, \ldots, x_{k+\Delta}]^T$, where $x_{k+1} \ldots, x_{k+\Delta}$ are the elements in the transformed data symbol vector $\underline{x}_1^*$ not also included in the data symbol vector $\underline{x}_1$.

Before formalizing the iterative technique for determining $S_1^*$ and $\underline{x}_1^*$, a relatively simple illustration is provided for a sample set of parameters. Consider the case where $$s_1 = \begin{pmatrix} 1 & 0 & 1 \\ 1 & 1 & 1 \\ 1 & 0 & 0 \end{pmatrix} \text{ and } x_1 = \begin{pmatrix} x_1 \\ x_2 \\ x_3 \end{pmatrix}.$$

A matrix multiplication of the product of $S_1$ and $\underline{x}_1$ requires evaluating the quantity $x_1+x_3$ (based on the first row of $S_1$) and the quantity $x_1+x_2+x_3$ (based on the second row of $S_1$), and therefore requires three additions. On the other hand, rewriting the quantity $x_1+x_2+x_3$ as $(x_1+x_3)+x_2$ reveals that the three addition operations involved in calculating the matrix product $S \times \underline{x}_1$ actually involves calculating the quantity $x+x_3$ twice, and therefore only involves two unique addition operations.

In matrix terms, this observation is captured by appending a new parameter, $x_1+x_3$, to the $\underline{x}_1$ vector. Thus, the transformed data symbol vector $\underline{x}_1^*$ is expressed $$\underline{x}_1^* = \begin{pmatrix} x_1 \\ x_2 \\ x_3 \\ x_1 + x_3 \end{pmatrix}.$$

The transformed generator matrix $S_1^*$ is then uniquely determined based on the required relationship $S_1^* \times \underline{x}_1^* = S_1 \times \underline{x}_1$. Thus, the transformed generator matrix is given by $$s_1^* = \begin{pmatrix} 0 & 0 & 0 & 1 \\ 0 & 1 & 0 & 1 \\ 1 & 0 & 0 & 0 \end{pmatrix}. \quad (6)$$

Note that $\underline{x}_1^*$ and $S_1^*$ necessarily have different dimensions than $\underline{x}_1$ and $S_1$, respectively. In particular, because one parameter, $x_1+x_3$, was appended to $\underline{x}_1$ to create $\underline{x}_1^*$, one extra column is appended to $S_1$ to create $S_1^*$. In general, and particularly for larger values of k and n than in this simple example, multiple redundant parameters will be identified in the matrix product of $\underline{x}_1$ and $S_1$. In general, if P parameters are appended to $\underline{x}_1$ to create $\underline{x}_1^*$, P extra columns will be appended to $S_1$ to create $S_1^*$. Further, note that in equation (6), the third column of the $S_1^*$ matrix includes only zero-valued elements, thus seemingly rendering unused the input parameter $x_3$ of the $\underline{x}_1^*$ vector. However, in an arrangement, no parameters from the $\underline{x}_1$ vector are removed in creating the $\underline{x}_1^*$ vector for reasons that will be explained in relation to step 250, below. The iterative technique for determining $\underline{x}_1^*$ from $\underline{x}_1$ and $S_1^*$ from $S_1$ is formalized in relation to FIG. 3, below.

Returning to the process 200, at the step 250, a transformed generator matrix $S_i^*$ and a transformed data symbol vector $\underline{x}_i^*$ are obtained corresponding to each bit-plane from the second bit-plane to the $m^{th}$ bit-plane (i.e., for each value of i from 2 to m) through "reverse mapping." In particular, $S_i^*$ is determined to be the matrix satisfying the relationship $$S_i^* \times \underline{x}_1 = S_i \times x_i \quad (7)$$

for each value of i from 2 to m. Any suitable linear algebra technique may be used to solve equation (7) for $S_i^*$. One or more transformed generator matrices, $S_2^*$ through $S_m^*$, may use an input data symbols not used by $S_1^*$. This is why, in an arrangement, parameters from the vector $\underline{x}_1$ are not removed during the calculation of the vector $\underline{x}_1^*$ at the step 240, i.e., because those parameters may be used by one or more of the transformed generator matrices, $S_2^*$ through $S_m^*$, even if they not used by the transformed generator matrix $S_1^*$.

At step 260, instructions are generated for the construction of a Reed-Solomon encoding architecture based on the data symbol vector $\underline{x}_1^*$ and the transformed generator matrices $S_1^*$ through $S_m^*$. As explained in relation to FIG. 4, below, the architecture includes m+1 adder banks. The instructions generated at the step 260 may be in any suitable form. For example, they instructions may be in the form of a logic configuration or layout file.

Figure 3:
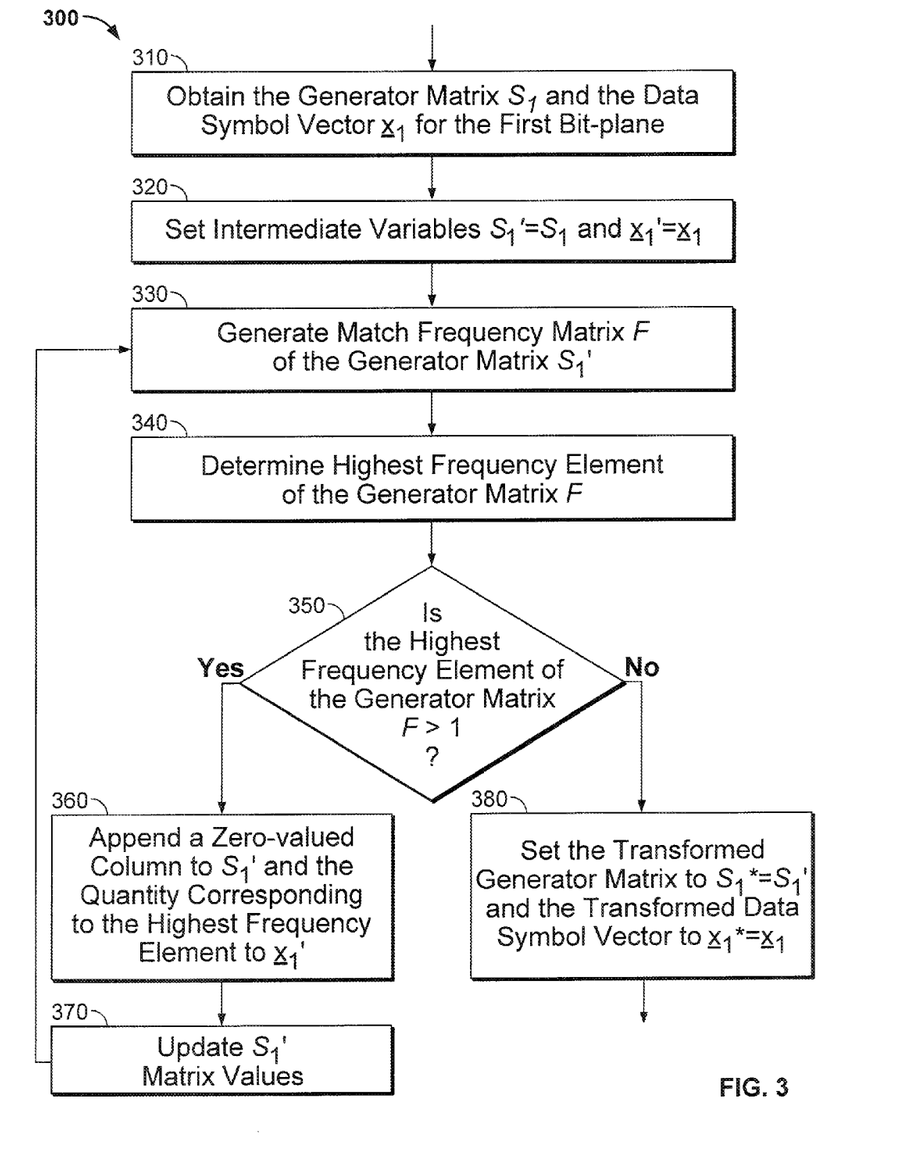
FIG. 3 illustrates a process for determining a transformed generator matrix and a transformed data symbol vector for a first bit-plane of a Reed-Solomon code in accordance with an embodiment of the present invention.

FIG. 3 illustrates a process for determining a transformed generator matrix $S_1^*$ and a transformed data symbol vector $\underline{x}_1^*$ for a first bit-plane of a Reed-Solomon code in accordance with an embodiment of the present invention. In an arrangement, process 300 corresponds to a more detailed implementation of the step 240 of FIG. 2. At step 310, the n–k×k generator matrix $S_1$ and the data symbol vector $\underline{x}_1$ for the first bit-plane of a Reed-Solomon code are obtained. At step 320, intermediate variables are initialized. In particular, the intermediate transformed generator matrix $S_1'$ is set to the value of $S_1$ and the intermediate data symbol vector $\underline{x}_1'$ is set to the value $\underline{x}_1$.

At step 330, the match frequency matrix F is computed corresponding to the intermediate transformed generator matrix $S_1'$. In particular, the element in the $j^{th}$ row and $i^{th}$ column of the matrix F, denoted $F_{ij}$ is equal to the number of times that $s_{vi}=s_{vj}=1$ for all values of v from 1 to n–k, where $s_{vi}$ and $s_{vj}$ are elements from the intermediate transformed generator matrix $S_1'$.

At step 340, the highest frequency element of the generator matrix F, i.e., the largest value included in the generator matrix F, is determined. At step 350, it is determined if the highest frequency element is greater than the value 1. If not, the process 300 proceeds to step 380, where the transformed generator matrix $S_1^*$ is set equal to the value $\underline{S}_1'$ and the transformed data symbol vector $\underline{x}_1^*$ is set equal to the value $\underline{x}_1'$. On the other hand, if it is determined that the highest frequency element of the frequency matrix F is greater than the value 1 at the step 350, then process 300 proceeds to step 360.

At the step 360, the intermediate variables $S_1'$ and $\underline{x}_1'$ are modified. In particular, a zero-valued column is added as the right-most column of the intermediate transformed generator matrix $S_1'$. Further, the variable quantity corresponding to the highest frequency element is appended to the intermediate data symbol vector $\underline{x}_1'$. For example, in the illustration provided in relation to FIG. 2, above, the variable quantity $x_1+x_3$ would be appended to the $\underline{x}_1'$ vector at the step 360.

At step 370, element-wise values of the intermediate transformed generator matrix $S_1'$ are updated. In particular, if the highest frequency element of the frequency matrix F (as determined at the step 340) is located at position $F_{ij}$, then the intermediate transformed generator matrix $S_1'$ is updated by setting $s_{xi}'=s_{xj}'=0$ and $s_{xn+1}'=1$ for all matching rows x. The process 300 then returns to the step 330, where the match frequency matrix F is recomputed based on the updated intermediate transformed generator matrix $S_1'$ computed at the steps 360 and 370.

Figure 4:
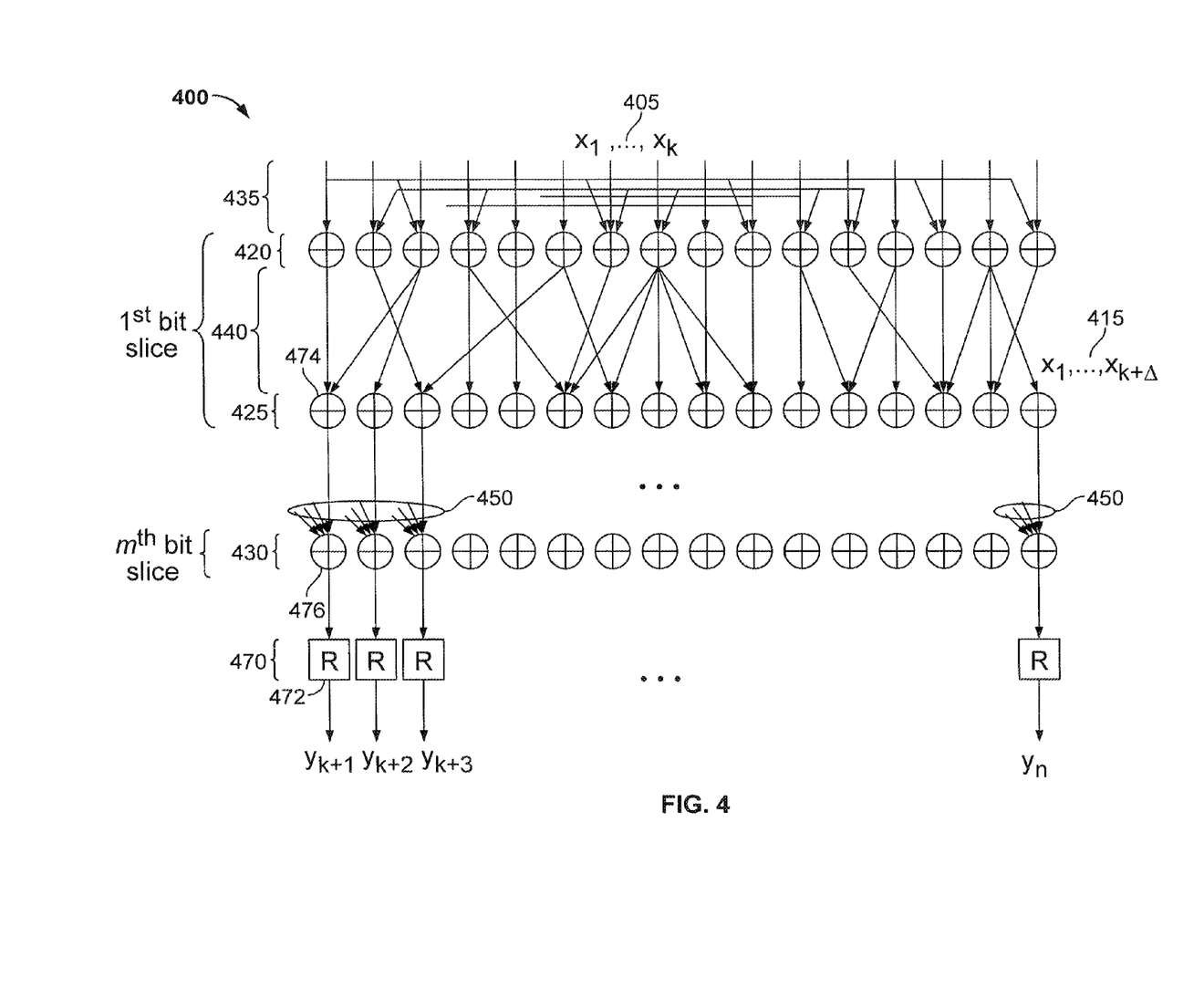
FIG. 4 illustrates a Reed-Solomon encoding architecture based on transformed generator matrices for each of m bit-planes and a transformed data symbol vector in accordance with an embodiment of the present invention.

FIG. 4 illustrates a Reed-Solomon encoding architecture based on transformed generator matrices for each of m bit-planes and a transformed data symbol vector in accordance with an embodiment of the present invention. As depicted in architecture 400, the first bit-plane of the architecture 400 corresponds to two adder banks, i.e., adder banks 420 and 425, while the remaining m−1 bit-planes correspond to one adder bank each (for example, adder bank 430 is a single adder bank corresponding to the $m^{th}$ bit-plane of the architecture 400).

As illustrated in FIG. 4, data symbols 405 are provided as inputs in the architecture 400. In particular, the data symbols 405 are $x_1, x_2 \ldots x_k$, i.e., the elements of the data symbol vector $\underline{x}$. Data connections 435 provide inputs to the adders of the adder bank 420 so that the outputs of the adder bank 420, i.e., data symbols 415, correspond to the elements of the transformed data symbol vector $\underline{x}_1^*=[x_1, x_2, \ldots, x_{k+\Delta}]^T$. Next, the adder bank 425 receives input via data connections 440, which correspond to the transformed generator matrix $S_1^*$, to produce the output $\underline{y}_1$ on the left-hand side of equation (2). Thus, in contrast to the architecture 100 of FIG. 1, the architecture 400 produces the output $\underline{y}_1$ using the transformed data symbol vector $\underline{x}_1^*$ and data connections based on the transformed generator matrix $S_1^*$ instead of using the data symbol vector $\underline{x}_1$ and data connections based on the generator matrix $S_1$. As a result, the architecture 400 requires fewer addition operations to compute the output $\underline{y}_1$ as compared to the number of addition operations that would be required by the architecture 100.

Each of the remaining adder banks of the architecture 400 compute the n−k outputs of one of $\underline{y}_2$ through $\underline{y}_m$ based on the transformed data symbol vector $\underline{x}_1^*$ and a corresponding transformed generator matrices, $S_2^*$ through $S_m^*$ determined through reverse mapping as explained in relation to the step 250 of FIG. 2. For example, the adder bank 430 determines the n−k outputs of $\underline{y}_m$ using data connections 450, which provide connections corresponding to the non-zero entries of the transformed generator matrix $S_m^*$.

The reducers of reducer bank 470 are used to appropriately combine the outputs of the adders of the architecture 400 to produce the n−k check symbols $y_{k+1}, y_{k+2}, \ldots, y_n$. For example, reducer 472 shifts and sums the outputs of the m adders in the left-most data path of the architecture 400 (which includes adders 474 and 476) to produce check symbol $y_{k+1}$.

Figure 5:
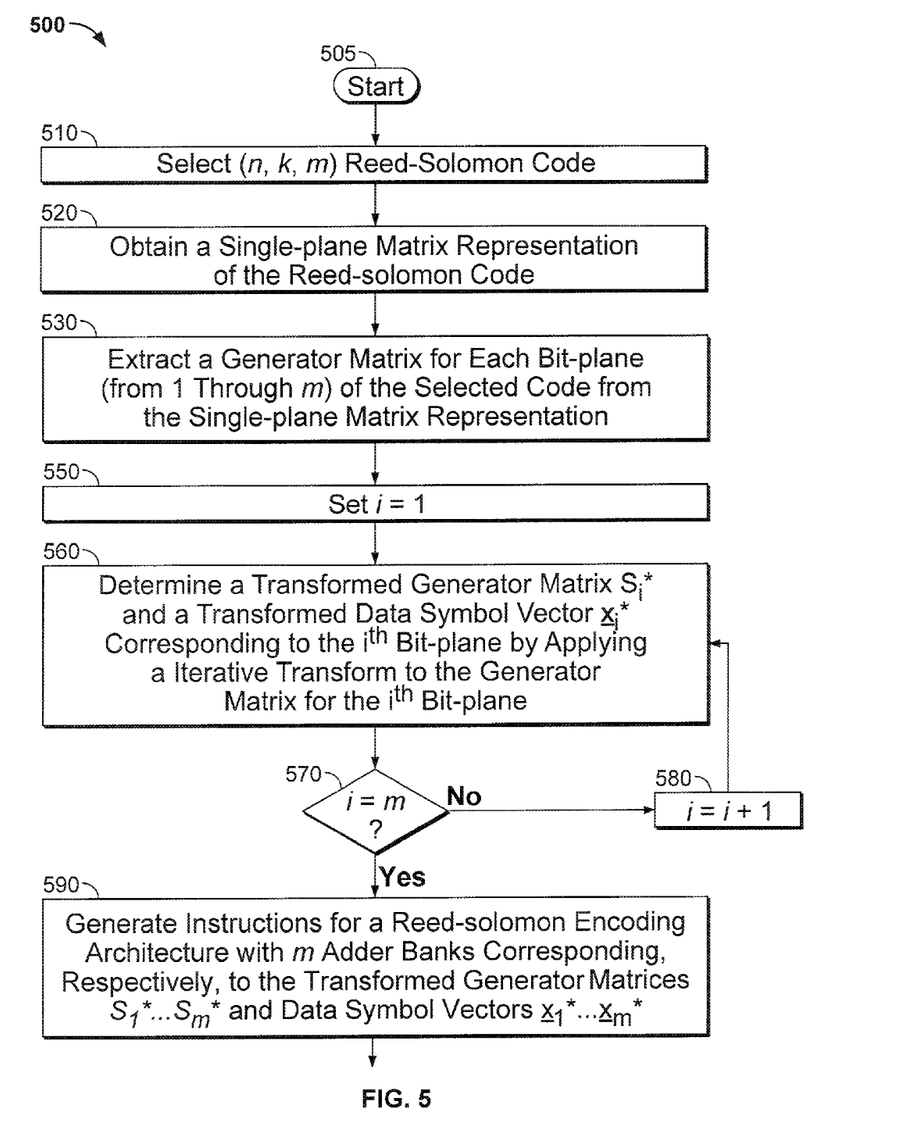
FIG. 5 illustrates another process for configuring a bit-plane based Reed-Solomon encoding architecture using a reduced amount of addition logic in accordance with an embodiment of the present invention.

FIG. 5 illustrates another process for configuring a bit-plane based Reed-Solomon encoding architecture using a reduced amount of addition logic in accordance with an embodiment of the present invention. Process 500 differs from the process 200 because a transformed generator matrix $S_i^*$ and a transformed data symbol vector $\underline{x}_i^*$ are independently optimized for every value of i between 2 and m. In contrast, in the process 200, a transformed generator matrix $S_i^*$ and a transformed data symbol vector $\underline{x}_i^*$ were optimized for i=1 and then "reverse-mapping" was used based on $\underline{x}_1^*$ to produce a transformed generator matrix $S_i^*$ for every value of i between 2 and m. In particular, because the process 500 optimizes $S_i^*$ and $\underline{x}_i^*$ independently for every value of i, a Reed-Solomon architecture configured based on the process 500 will require fewer addition operations (hence, fewer ALUTs) than a comparable architecture configured based on the process 200.

The process 500 starts at step 505. At step 510, a (n, k, m) Reed-Solomon code is selected, at step 520 a single-plane matrix representation (i.e., the data vector $\underline{x}$ and the encoding matrix S) of the Reed-Solomon code selected at the step 510 is obtained, and at step 530 a m-plane representation of the Reed-Solomon code is extracted from the data vector $\underline{x}$ and the encoding matrix S. The steps 510, 520, and 530 are performed similarly or identically to the steps 210, 220, and 230, respectively, of FIG. 2.

At step 550, a counter variable i is set equal to the value 1. At step 560, a transformed generator matrix $S_i^*$ and a transformed data symbol vector $\underline{x}_i^*$ are obtained for the $i^{th}$ bit-plane based on the quantities $S_i$ and $\underline{x}_i$ extracted at the step 530. In particular, the quantities $S_i^*$ and $\underline{x}_i^*$ are determined though an iterative processing technique (possibly using just a single iteration) so that their respective matrix products are equivalent, i.e., $$S_i^* \underline{x}_i^* = S_i \times \underline{x}_i.$$

The quantity $\underline{x}_i$ includes all the elements of $\underline{x}_i$ in addition to $\Delta$ additional elements, where $\Delta$ is a non-negative integer. Thus, omitting subscripts i for brevity on the right-hand side of the following equation, $\underline{x}=[x_1, x_2, \ldots, x_{k+\Delta}]^T$, where $x_{k+1} \ldots x_{k+\Delta}$, are the additional elements in the transformed data symbol vector $\underline{x}_i^*$ not also included in the data symbol vector $\underline{x}_i$. In an arrangement, the optimization performed at the step 560 is performed using steps similar or identical to those of the process 300 of FIG. 3.

At step 570 the counter variable i is compared to the value m. If i does not equal m, then the value of the counter i is incremented by one at step 580 and the process 500 returns to the step 560. Otherwise, the process 500 continues to step 590. At the step 590, instructions are generated for the construction of a Reed-Solomon encoding architecture based on the transformed data symbol vectors $\underline{x}_1^*$ through $\underline{x}_m^*$ and the transformed generator matrices $S_1^*$ through $S_m^*$. As explained in relation to FIG. 5, below, the architecture includes 2m adder banks. The instructions generated at the step 590 may be in any suitable form. For example, the instructions may be in the form of a logic configuration or layout file.

Figure 6:
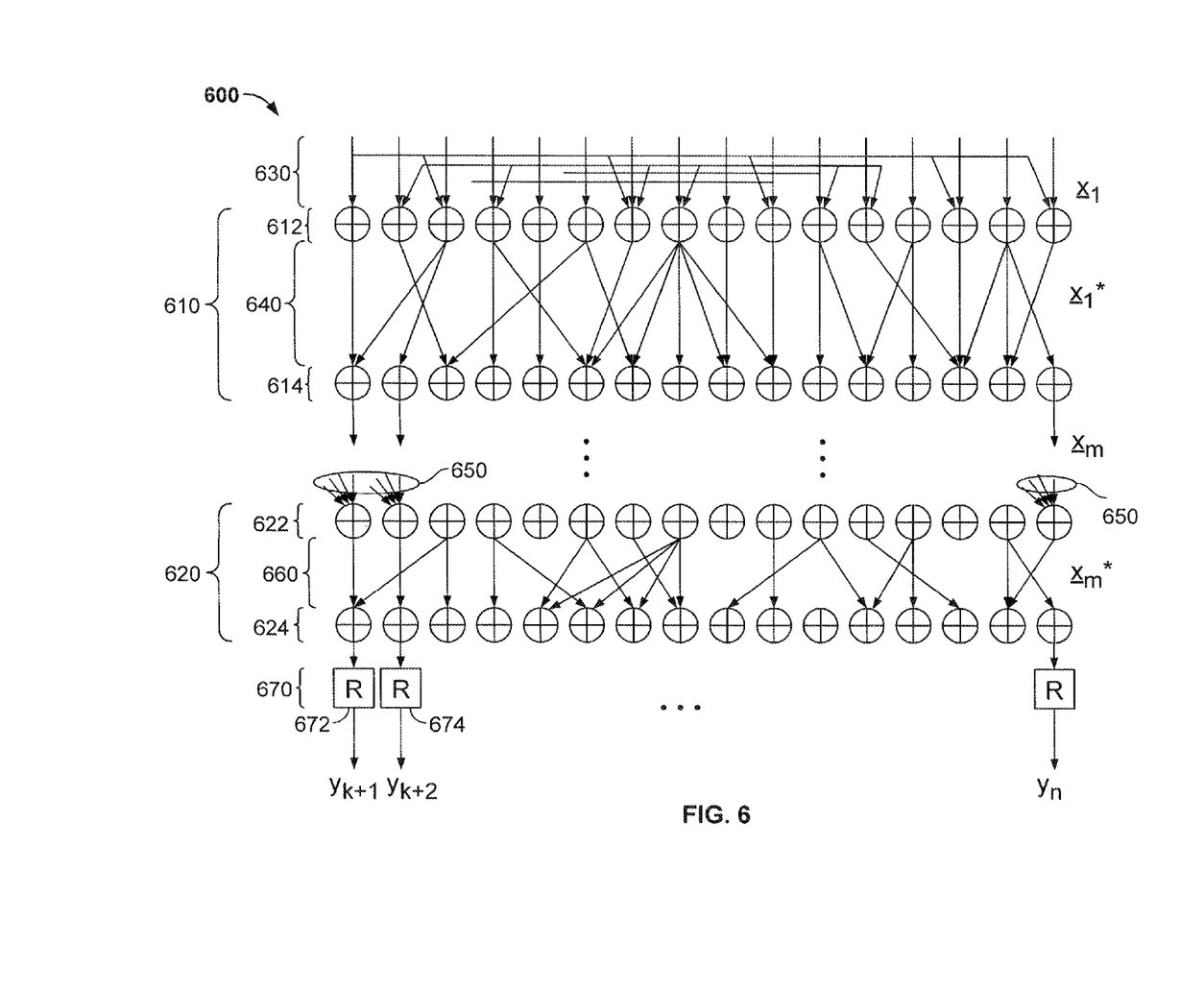
FIG. 6 illustrates a Reed-Solomon encoding architecture based on transformed generator matrices and transformed data symbol vector for each of m bit-planes of a Reed-Solomon code in accordance with an embodiment of the present invention.

FIG. 6 illustrates a Reed-Solomon encoding architecture based on transformed generator matrices $S_1^*$ through $S_m^*$ and transformed data symbol vectors $\underline{x}_1^*$ through $\underline{x}_m^*$ obtained using the process 500 of FIG. 5 in accordance with an embodiment of the present invention. As illustrated in FIG. 6, there are 2m adder banks in architecture 600, with two adder banks dedicated to each of the m bit slices of a Reed-Solomon code. For example, circuitry 610 corresponds to the first bit-slice and includes adder banks 612 and 614. Data connections 630 provide to the adder bank 612 the data symbol vector $\underline{x}_1$ and the adder bank 612 processes its input to produce the transformed data symbol vector $\underline{x}_1^*$, determined according to the process 500. Data connections 640 are configured according to the non-zero entries of the transformed generator matrix $S_1^*$ determined by the process 500 and the data connections 640 provide the transformed data symbol vector $\underline{x}_1^*$ to the adder bank 614.

Circuitry 620 corresponds to the $m^{th}$ bit-slice and includes adder banks 622 and 624. Data connections 650 provide to the adder bank 622 the data symbol vector $\underline{x}_m$ and the adder bank 622 processes its input to produce the transformed data symbol vector $\underline{x}_m{}^*$, determined according to the process 500. Data connections 660 are configured according to the non-zero entries of the transformed generator matrix $S_m{}^*$ determined by the process 500 and the data connections 660 provide the transformed data symbol vector $\underline{x}_m{}^*$ to the adder bank 624.

The second adder bank dedicated to each of the m bit slices of a Reed-Solomon code produces one of the outputs $\underline{y}_1$ through $\underline{y}_m$. For example, the adder banks 614 and 624 produce the output vectors $\underline{y}_1$ and $\underline{y}_m$, respectively. The reducers of reducer bank 670 are used to appropriately combine and shift the outputs $\underline{y}_1$ through $\underline{y}_m$ to produce the n–k check symbols $y_{k+1}, y_{k+2}, \ldots, y_n$. For example, reducer 672 shifts and sums the outputs of the m adders in the left-most data path of the architecture 600 to produce check symbol $y_{k+1}$.

As would be understood by one of ordinary skill in the art, based on the disclosure and teaching herein, each of the adders described in relation to FIGS. 1, 4, and 6 is a Galois field adder in which addition is performed through an exclusive-OR (XOR) operation. For example, each of the adders of adder banks 110 (FIG. 1), 130 (FIG. 1), 420 (FIG. 4), 425 (FIG. 4), 430 (FIG. 4), 612 (FIG. 6), 614 (FIG. 6), 622 (FIG. 6), and 624 (FIG. 6) is such a Galois field adder.

It will be understood that the foregoing is only illustrative of the principles of the invention, and that various modifications may be made by those skilled in the art without departing from the scope and spirit of the invention, and the present invention is limited only by the claims that follow.

What is claimed is:

1. Circuitry for producing a plurality of check symbols comprising:
   input circuitry configured to receive a data vector comprising a plurality of data symbols, each data symbol having a bit-depth m;
   a plurality of adder banks comprising:
      a first adder bank configured to process the data vector to produce a transformed data vector by appending a plurality of parameters to the data vector;
      a plurality of m additional adder banks, each configured to process a respective bit-slice of the transformed data vector to produce an output based on a respective reverse-mapped generator matrix; and
      a reducer bank configured to process the outputs of each of the plurality of m additional adder banks to produce the plurality of check symbols.

2. The circuitry of claim 1, wherein each reverse-mapped generator matrix is produced based on the transformed data vector.

3. The circuitry of claim 1, further comprising:
   a plurality of m sets of data connections corresponding, respectively, to inputs to the plurality of m additional adder banks.

4. The circuitry of claim 1, wherein the plurality of parameters is generated according to an iterative matrix transform.

5. The circuitry of claim 3, wherein the set of data connections corresponding to a given adder bank in the plurality of m additional adder banks is based on the non-zero entries of a corresponding reverse-mapped generator matrix.

6. A method for configuring an encoder architecture comprising:
   obtaining a matrix representation of a block code comprising m bit-planes;
   extracting a generator matrix corresponding to each of the m bit-planes from the matrix representation;
   determining a transformed generator matrix and a transformed data symbol vector for the first bit-plane of the block code;
   determining a reverse-mapped transformed generator matrix for each of the second bit-plane through the $m^{th}$ bit-plane of the block code; and
   generating instructions for the encoder architecture based on the transformed generator matrix for the first bit-plane and the reverse-mapped transformed generator matrix for each of the second bit-plane through the $m^{th}$ bit-plane of the block code.

7. The method of claim 6, wherein determining the reverse-mapped transformed generator matrix for a bit-plane of the block code is based on the transformed data symbol vector.

8. The method of claim 6, further comprising extracting a data symbol vector from the first plane of the block code.

9. The method of claim 6, wherein determining the reverse-mapped transformed generator matrix for a bit-plane of the block code comprises generating a frequency match matrix based on the transformed generator matrix for the first bit-plane.

10. The method of claim 6, wherein the instructions are in the form of a configuration layout file.

11. The circuitry of claim 6, wherein the block code is a (n, k, m) Reed-Solomon code.

12. The circuitry of claim 6, wherein the instructions for the encoder architecture are for implementation in an Field Programmable Gate Array (FPGA).

13. The method of claim 9, wherein determining the reverse-mapped transformed generator matrix for the bit-plane of the block code further comprises adding a column to the reverse-mapped transformed generator matrix in response to a determination that a highest frequency element of the frequency match matrix is greater than a predefined value.

14. Circuitry for producing a plurality of check symbols comprising:
   input circuitry configured to receive a data vector comprising a plurality of data symbols, each data symbol having a bit-depth m;
   for each of m bit-slices of a block code,
      a first adder bank configured to process the data vector to produce a transformed data vector based on the respective bit-slice; and
      a second adder bank configured to process the transformed data vector based on a reverse-mapped generator matrix for the bit-slice to produce an output; and
      a reducer bank configured to process the output of each second adder bank corresponding to each of the m bit-slices of the block code to produce the plurality of check symbols.

15. The circuitry of claim 14, wherein the first adder bank is further configured to produce the transformed data vector by appending a plurality of parameters to the data vector.

16. The circuitry of claim 14, wherein each reverse-mapped generator matrix is produced based on the transformed data vector.

17. The circuitry of claim 16, wherein the plurality of parameters is generated according to an iterative matrix transform.

18. The circuitry of claim 14, wherein the block code is a (n, k, m) Reed-Solomon code.

19. The circuitry of claim 14, wherein the circuitry is implemented in an Field Programmable Gate Array (FPGA).

* * * * *